United States Patent
Liu et al.

(10) Patent No.: US 12,255,374 B2
(45) Date of Patent: Mar. 18, 2025

(54) FREQUENCY SELECTIVE COUPLER

(71) Applicant: QUALCOMM INCORPORATED, San Diego, CA (US)

(72) Inventors: Yu-Chun Liu, Altamonte Springs, FL (US); Xiaomin Yang, Longwood, FL (US); Arjun Ravindran, Orlando, FL (US)

(73) Assignee: QUALCOMM Incorporated, San Diego, CA (US)

( * ) Notice: Subject to any disclaimer, the term of this patent is extended or adjusted under 35 U.S.C. 154(b) by 184 days.

(21) Appl. No.: 17/681,306

(22) Filed: Feb. 25, 2022

(65) Prior Publication Data
US 2023/0275334 A1     Aug. 31, 2023

(51) Int. Cl.
| | |
|---|---|
| *H01P 1/212* | (2006.01) |
| *H01P 5/12* | (2006.01) |
| *H01P 5/18* | (2006.01) |
| *H03H 7/01* | (2006.01) |

(52) U.S. Cl.
CPC ............... *H01P 1/212* (2013.01); *H01P 5/12* (2013.01); *H01P 5/184* (2013.01); *H03H 7/0138* (2013.01)

(58) Field of Classification Search
CPC .. H01P 1/212; H01P 5/12; H01P 5/184; H01P 5/18
USPC ........................... 333/109, 204, 205
See application file for complete search history.

(56) References Cited

U.S. PATENT DOCUMENTS

| | | | |
|---|---|---|---|
| 2014/0292360 A1* | 10/2014 | Morgenstern | H01P 5/183 333/112 |
| 2015/0042412 A1 | 2/2015 | Imbornone et al. | |
| 2017/0250666 A1 | 8/2017 | Whitefield et al. | |
| 2020/0076045 A1 | 3/2020 | Seki et al. | |
| 2021/0036395 A1 | 2/2021 | Seki et al. | |

OTHER PUBLICATIONS

International Search Report and Written Opinion—PCT/US2023/060716—ISA/EPO—May 15, 2023.

* cited by examiner

*Primary Examiner* — Rakesh B Patel
(74) *Attorney, Agent, or Firm* — Smith Tempel Blaha LLP

(57) ABSTRACT

A frequency selective coupler configured as a harmonic rejection filter includes an electromagnetic element configured to electromagnetically couple to a signal path between an output of a power amplifier and an antenna, an impedance network coupled between an isolated port of the coupler and ground, the impedance network configured to provide a harmonic filter response, and an electrically unconnected coupled port connected to the electromagnetic element.

27 Claims, 16 Drawing Sheets

FREQUENCY SELECTIVE COUPLER

FIELD

The present disclosure relates generally to electronics, and more specifically to filtering in communication devices.

BACKGROUND

Wireless communication devices and technologies are becoming ever more prevalent. Wireless communication devices generally transmit and receive communication signals. A communication signal is typically processed by a variety of different components and circuits. One of the circuits that process a communication signal is a transceiver. A transceiver may include a transmitter and a receiver. Some wireless communication devices may be configured to operate on a variety of different communication bands. For example, a modern wireless communication device may be configured to operate on radio spectrum covering both 5G and 4G LTE frequencies. In some instances, a modern wireless communication device may be configured to operate simultaneously on 5G and 4G LTE frequencies in what can be referred to as carrier aggregation (CA) in which a wireless communication device may simultaneously communicate over multiple carriers.

Many transceivers use a switch network to allow the transceiver to both transmit and receive signals. Sometimes such a switch network is part of what is referred to as a radio frequency (RF) front end. Such switches typically include filtering capability to prevent transmit signals from interfering with receive signals, and to prevent receive signals from interfering with transmit signals. Such filtering should be able to filter out-of-band (OOB) signals and harmonics, should be performed with low insertion loss and should minimally impact signal impedance.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a frequency selective coupler configured as a harmonic rejection filter, including an electromagnetic element configured to electromagnetically couple to a signal path between an output of a power amplifier and an antenna, an impedance network coupled between an isolated port of the coupler and ground, the impedance network configured to provide a harmonic filter response, and an electrically unconnected coupled port connected to the electromagnetic element.

Another aspect of the disclosure provides a frequency selective coupler associated with a filter including an electromagnetic element configured to electromagnetically couple to a signal path of a filter, an impedance network coupled between an isolated port of the coupler and ground, the impedance network configured to provide a filter response, and an electrically unconnected coupled port connected to the electromagnetic element.

Another aspect of the disclosure provides a frequency selective coupler including an electromagnetic element configured to electromagnetically couple to a signal path, an impedance network coupled between an isolated port of the coupler and ground, the impedance network configured to selectively adjust a frequency at which the coupler provides a filter response, and an electrically unconnected coupled port connected to the electromagnetic element.

Another aspect of the disclosure provides a method for providing signal rejection including electromagnetically coupling an electromagnetic element to a signal path, and selectively adjusting a frequency at which a filter response is provided to a signal on the signal path using a frequency selective coupler.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a frequency selective coupler that can be inserted in a variety of locations in a communication path.

Exemplary embodiments of the disclosure are directed to a frequency selective coupler that has a low insertion loss, minimal effect on signal impedance and that provides high frequency signal rejection at a number of different selectable frequencies.

Exemplary embodiments of the disclosure are directed to a frequency selective coupler that can enhance out-of-band (OOB) rejection using a coupling path having no physical connection to the signal path without adding additional costly and lossy lump elements at the signal path.

Exemplary embodiments of the disclosure are directed to a frequency selective coupler that can be implemented as a harmonic filter.

Figure 1:
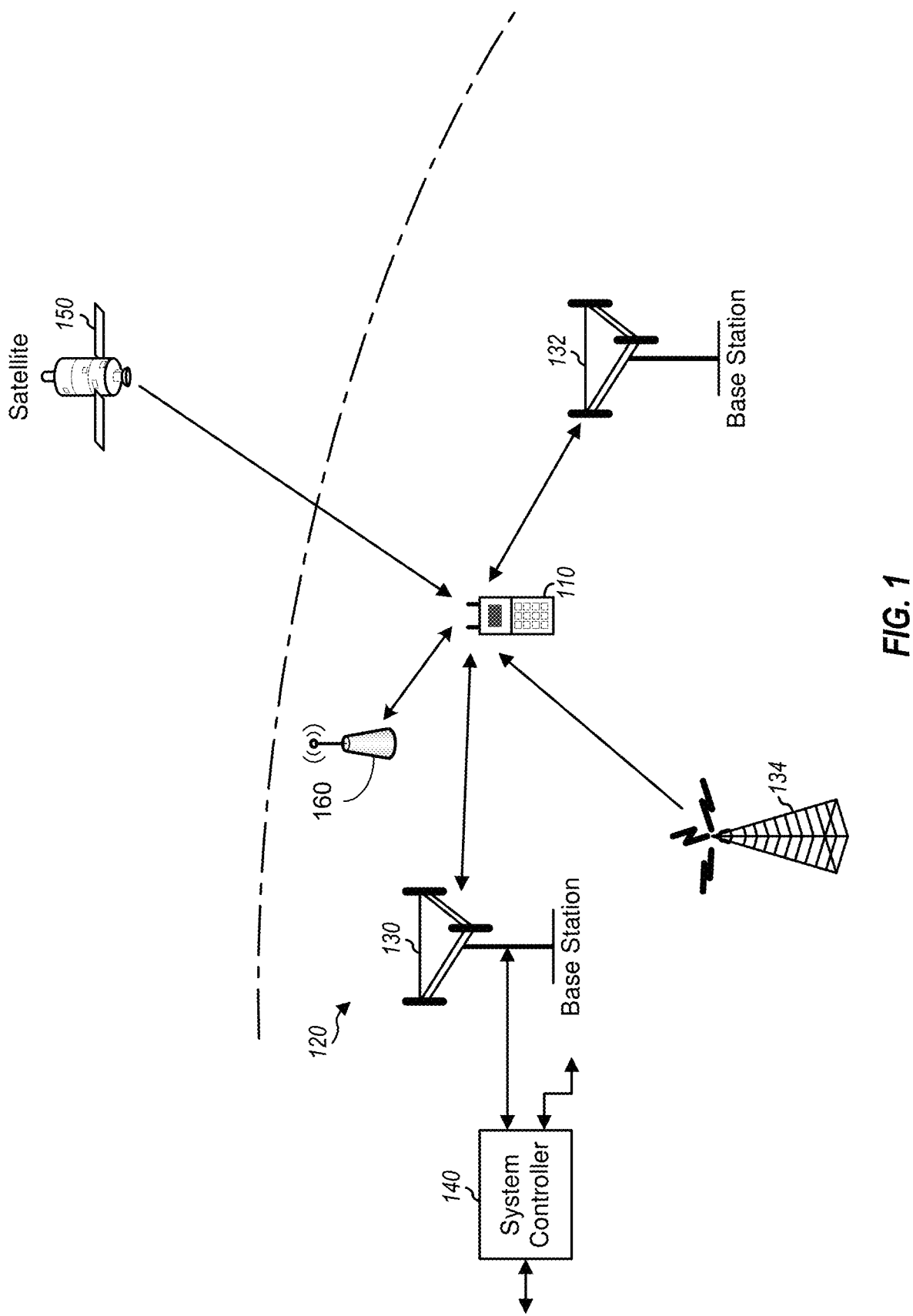
FIG. 1 is a diagram showing a wireless device communicating with a wireless communication system.

FIG. 1 is a diagram showing a wireless device 110 communicating with a wireless communication system 120. The wireless communication system 120 may be a 5G NR (new radio) system, Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as 5G NR, LTE, WCDMA, CDMA 1x, EVDO, TD-SCDMA, GSM, 802.11, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams.

Wireless device 110 may be able to operate in a low-band (LB) covering frequencies lower than 1000 megahertz (MHz), a mid-band (MB) covering frequencies from 1000 MHz to 2300 MHz, and/or a high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 5000 MHz. Low-band, mid-band, and high-band refer to three groups of bands (or band groups), with each band group including a number of frequency bands (or simply, "bands"). Each band may cover up to 200 MHz in some configurations and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11. Wireless device 110 may further be able to operate at frequencies higher than 5000 MHz, for example at frequencies up to 6 or 7 GHz and/or at mmW frequencies. Frequencies of approximately 20 GHz or higher, for example around 24 GHz or higher, may be considered mmW frequencies.

The wireless device 110 may also be in communication with a wireless device 160. In an exemplary embodiment, the wireless device 160 may be a wireless access point, or another wireless communication device that comprises, or comprises part of a wireless local area network (WLAN). An exemplary embodiment of a WLAN signal may include WiFi, or other communication signals that use unlicensed communication spectrum in the range of, for example, 5 GHz to 6 GHz or in mmW frequencies. The wireless device 110 may also be capable of ENDC (E-UTRAN New Radio Dual Connectivity), where the wireless device 110 may simultaneously be in communication with a first base station (for example, an eNodeB) and with a second base station (for example, a gNodeB).

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
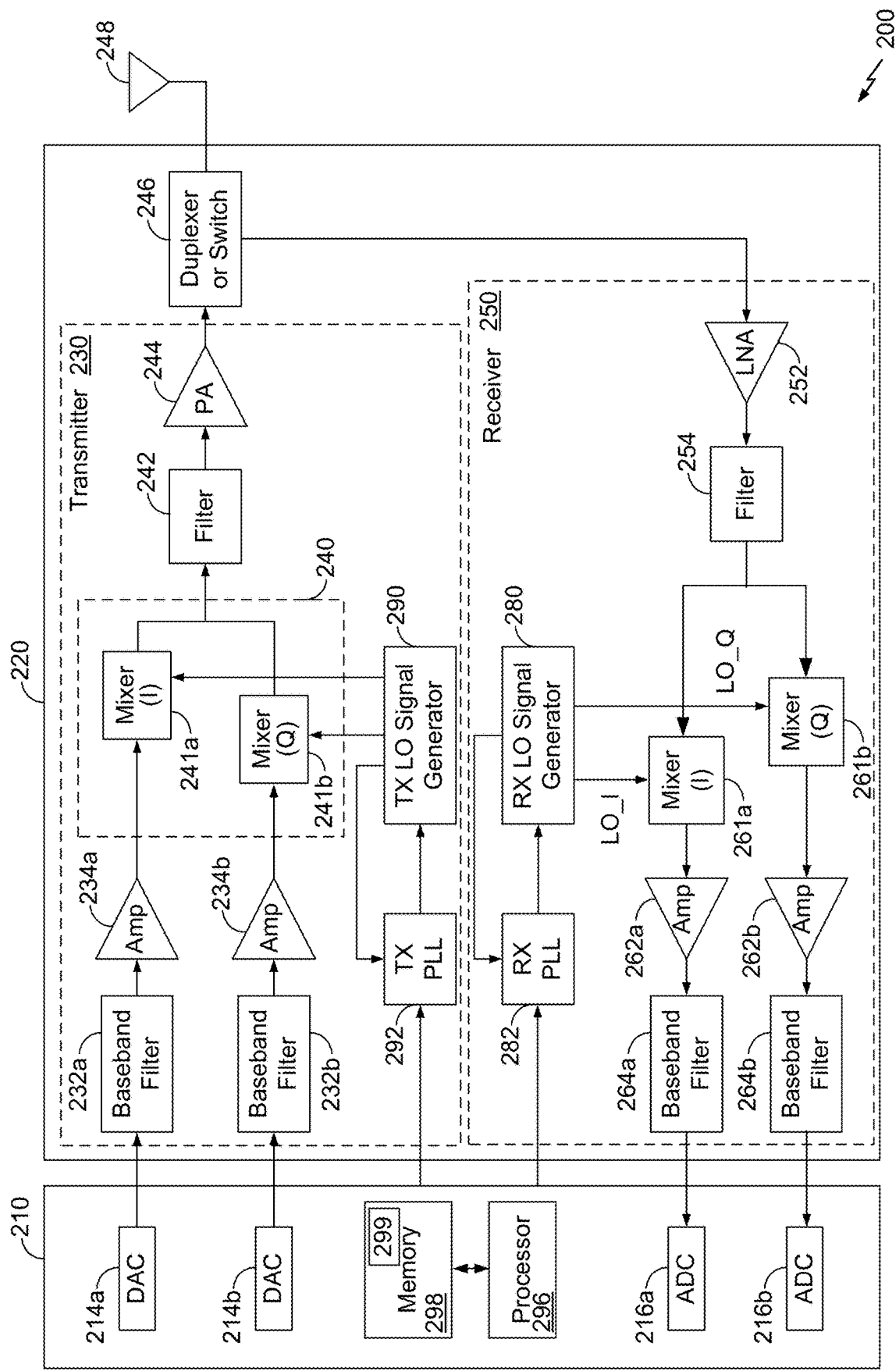
FIG. 2 is a block diagram showing a wireless device in which exemplary techniques of the present disclosure may be implemented.

FIG. 2 is a block diagram showing a wireless device 200 in which the exemplary techniques of the present disclosure may be implemented. The wireless device 200 may be an example of the wireless device 110 in some embodiments. In other embodiments, the wireless device 200 may be an example of one of the base stations, 130, 132, the wireless device 160, a device not illustrated in FIG. 1 such as a customer premises equipment (CPE), etc. FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, as exemplary software or firmware 299, and may generally comprise analog and/or digital processing elements. The processor 296 and the memory 298 may cooperate to control, configure, program, or otherwise fully or partially control some or all of the operation of the embodiments of the frequency selective coupler described herein.

The transceiver 220 includes a transmitter 230 and a receiver 250 that support bi-directional communication. In general, wireless device 200 may include any number of transmitters and/or receivers for any number of communication systems and frequency bands. In some embodiments, only a transmitter or only a receiver may be implemented. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband, or near baseband, in one stage. The super-heterodyne and direct-conversion architectures may use different circuit blocks and/or have different requirements. In the example shown in FIG. 2, transmitter 230 and receiver 250 are implemented with the direct-conversion architecture. In other examples a super-heterodyne architecture may be used.

In the illustrated transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more bias signals and can be configured in various topologies or architectures.

In the receive path, antenna 248 receives communication signals and provides a received RF signal, which may be routed through duplexer or switch 246 and provided to a low noise amplifier (LNA) 252. The duplexer 246 may be designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally. In some embodiments, the variable gain control system and method described herein may be implemented within the LNA 252.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals on multiple downlink carriers at different frequencies and/or (ii) transmit multiple uplink signals on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the PA 244, the filter 242, the LNA 252, and/or the duplexer 246 may be implemented in separate modules or as discrete components, while the remaining elements illustrated in the transceiver 220 may be implemented in a single transceiver chip. Further, while FIG. 2 illustrates I and Q signals, those of skill in the art will understand that the transceiver 220 may alternatively be implemented using a polar architecture or may include elements to implement a polar architecture in addition to a quadrature architecture.

Exemplary embodiments of the frequency selective coupler described herein may be implemented before or after the filter 242 and/or after the power amplifier 244, and/or in the duplexer or switch 246 and/or before or after the filter 254, or elsewhere.

Figure 3:
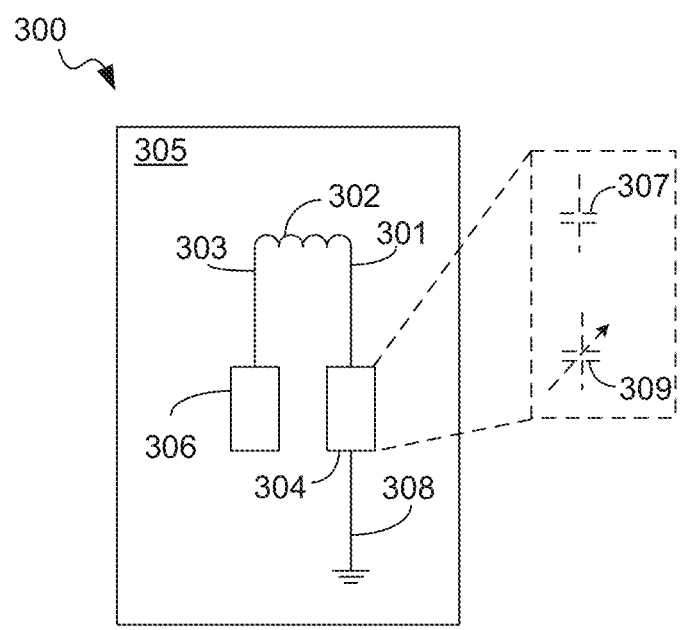
FIG. 3 is a schematic diagram showing an exemplary embodiment of a frequency selective coupler.

FIG. 3 is a schematic diagram 300 showing an exemplary embodiment of a frequency selective coupler 305. In an exemplary embodiment, the frequency selective coupler 305 comprises an electromagnetic element 302, an impedance network 304 and an electrically unconnected element 306. In an exemplary embodiment, the electromagnetic element 302 may be an inductive element configured to electromagnetically couple to a signal path (not shown in FIG. 3). In an exemplary embodiment, the impedance network 304 may be connected between an isolated port 301 of the frequency selective coupler 305 and a signal ground 308. In an exemplary embodiment, the electrically unconnected element 306 may form or be connected to a coupled port 303 of the frequency selective coupler 305.

A directional coupler is generally a four port device having an input port, an output port, a coupled port and an isolated port. As used herein, the term "coupled port" refers to the port on the directional coupler having a small portion of the signal traveling between the input port and the output port. The term "isolated port" refers to the fourth port of the coupler that does not have any portion of the signal traveling between the input port and the output port (or at least the amount of signal traveling between the input port and the output port into the isolated portion is negligible or orders of magnitude less than that portion flowing into the coupled port). In an exemplary embodiment, the electrically unconnected element 306 may comprise a resistance.

The impedance network 304 may be configured to selectively adjust a frequency at which the frequency selective coupler 305 provides a selectable filter response. In an exemplary embodiment, the frequency selective coupler 305 may be configured to provide a selectable notch filter response. In an exemplary embodiment, the frequency selective coupler 305 may be controlled by a control signal from the data processor 210 (FIG. 2) or another controller. In an exemplary embodiment, depending on implementation and signal direction, the isolated port 301 and the coupled port 303 may be selectively connected to the impedance network 304 and the electrically unconnected element 306 by one or more switches (not shown in FIG. 3).

In an exemplary embodiment, the impedance network 304 may be implemented using one or more fixed value elements or one or more adjustable or variable elements. For example, the impedance network 304 may be implemented using a fixed value capacitance 307 or an adjustable capacitance 309. The fixed value capacitance 307 and the adjustable capacitance 309 are shown in FIG. 3 in phantom line to indicate that these are only examples of how the impedance network 304 may be implemented. Other fixed value or adjustable elements may also be used, such as, for example, a fixed or adjustable resistance, a fixed or adjustable inductance, or a combination of one or more of a fixed or adjustable capacitance, fixed or adjustable resistance and fixed or adjustable inductance. In an exemplary embodiment, the impedance network 304 may be implemented using multiple instances to achieve selective filter responses at multiple frequencies. In an exemplary embodiment, the electrically unconnected element 306 has a first side connected to the coupled port 303 of the frequency selective coupler 305 and a second side being electrically unconnected.

Figure 4A:
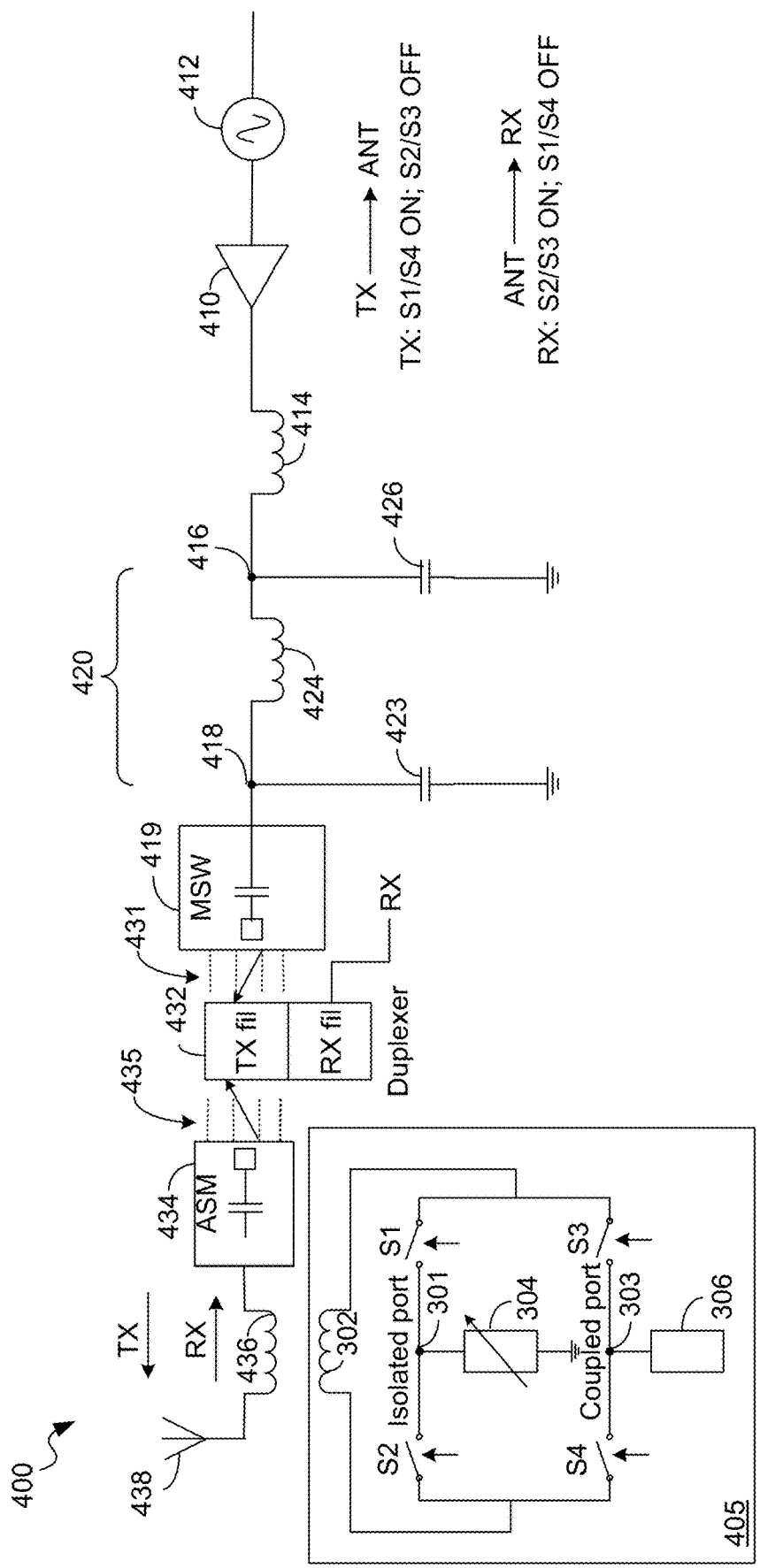
FIG. 4A is a schematic diagram showing an exemplary embodiment of an implementation of the frequency selective coupler of FIG. 3.

FIG. 4A is a schematic diagram showing an exemplary embodiment of an implementation of the frequency selective coupler 305 of FIG. 3. In FIG. 4A, the frequency selective coupler is referred to using reference numeral 405, but it is similar to the frequency selective coupler 305 described in FIG. 3. In an exemplary embodiment, the frequency selective coupler 405 may comprise switches S1, S2, S3 and S4. In an exemplary embodiment, the switches S1 and S3 may be connected to one side of the inductive element 302 and the switches S2 and S4 may be connected to another side of the inductive element 302.

In an exemplary embodiment, a circuit 400 in which the frequency selective coupler 405 may be implemented includes a power amplifier 410 that receives a transmit signal from a mixer 412. An output of the power amplifier 410 is provided to an electromagnetic element, illustrated as 410 an inductance 414. A trap circuit 420 is coupled to the electromagnetic element 414. In an exemplary embodiment, the trap circuit 420 may comprise a filter circuit configured to attenuate signals at a desired frequency. In an exemplary embodiment, the trap circuit 420 may comprise one or more resistive, inductive and/or capacitive components. In an exemplary embodiment, the trap circuit 420 may comprise an inductance 424, a capacitance 423, and a capacitance 426. In an exemplary embodiment, the trap circuit 420 may be configured to filter second order harmonics (H2)/or third order harmonics (H3). Second order harmonics may cause intermodulation distortion when two or more signals exist in a non-linear system.

In an exemplary embodiment, in a transmit direction, an input to the trap circuit 420 is provided a node 416 and an output of the trap circuit 420 is provided at node 418. A multiple output switch 419 (also referred to as a mode switch "MSW", which can switch signals in different frequency bands) is also coupled to the node 418 and may be configured to provide an output signal over one or more outputs 431. In an exemplary embodiment, the multiple output switch 419 may be controlled by a control signal from the data processor 210 (FIG. 2) or another controller.

In an exemplary embodiment, a filter circuit 432 may be coupled to the outputs 431 of the multiple output switch 419. In an exemplary embodiment, the filter circuit 432 may be configured to provide transmit signal filtering and receive signal filtering, and may be implemented as a duplexer. In some embodiments, the filter circuit 432 may be only a transmit filter or may be only a receive filter. In some embodiments, the filter circuit 432 may be an acoustic or an electroacoustic filter. Other elements, such as a diplexer may also be used in place of a duplexer.

In an exemplary embodiment, the filter circuit 432 may be coupled to an antenna switch module (ASM) 434. The antenna switch module 434 may be configured to select multiple inputs 435. In an exemplary embodiment, the antenna switch module (ASM) 434 may be controlled by a control signal from the data processor 210 (FIG. 2) or another controller. In some embodiments, the MSW 419 and the ASM 434 may be optional.

In an exemplary embodiment, the antenna switch module 434 may be connected to an electromagnetic element 436, which may be an inductive element. The electromagnetic element 436 is connected to an antenna 438. In an exemplary embodiment, the electromagnetic element 436 may be part of a signal path that carries a transmit (TX) signal and/or a receive (RX) signal.

The exemplary embodiment of the implementation of the frequency selective coupler 405 is referred to as a "load line" implementation because in a transmit direction the output of the power amplifier 410 may be referred to as a load line, which may extend between the output of the power amplifier 410 to the antenna 438. As used herein, the term load line refers to a resistive load in a common emitter circuit (when implemented using bipolar junction technology (BJT), or a common gate circuit (if implemented using a metal oxide semiconductor field effect transistor (MOSFET), and shows how the collector load resistance (BJT) constrains the circuit voltage and current.

In an exemplary embodiment, the electromagnetic coupling between the electromagnetic element 436 and the electromagnetic element 302 eliminates any physical connection between the signal path and the frequency selective coupler 405 and minimizes power dissipation and the impact of impedance on the signal path.

In an exemplary embodiment, the frequency selective coupler 405 may be implemented as a harmonic rejection filter to remove unwanted harmonics from the output of the power amplifier 410. In an exemplary embodiment, the frequency selective coupler 405 may provide a harmonic trap for filtering the communication signal propagating between the power amplifier 410 and the antenna 438.

In an exemplary embodiment, in a transmit direction, the switches S1 and S4 may be made conductive and the switches S2 and S3 may be made non-conductive so that the transmit signal is coupled from an input side of the electromagnetic element 302 through the switch S1 to the isolated port 301 and the transmit signal is coupled from an output side of the electromagnetic element 302 through the switch S4 to the coupled port 303. The coupled port 303 also provides the output of the frequency selective coupler 405.

In an exemplary embodiment, in a receive direction, the switches S2 and S3 may be made conductive and the switches S1 and S4 may be made non-conductive so that the receive signal is coupled from an input side of the electromagnetic element 302 through the switch S2 to the isolated port 301 and the receive signal is coupled from an output side of the electromagnetic element 302 through the switch S3 to the coupled port 303.

In an exemplary embodiment, the switches S1, S2, S3 and S4 may be controlled by a control signal from the data processor 210 (FIG. 2) or another controller. The coupled port 303 also provides the output of the frequency selective coupler 405. In an exemplary embodiment, the frequency selective coupler 405 may be configured to operate as a trap circuit or to provide a notch response. In an exemplary embodiment, the elements in the impedance network 304 contains fixed or adjustable components having values that create a particular filter response.

Figure 4B:
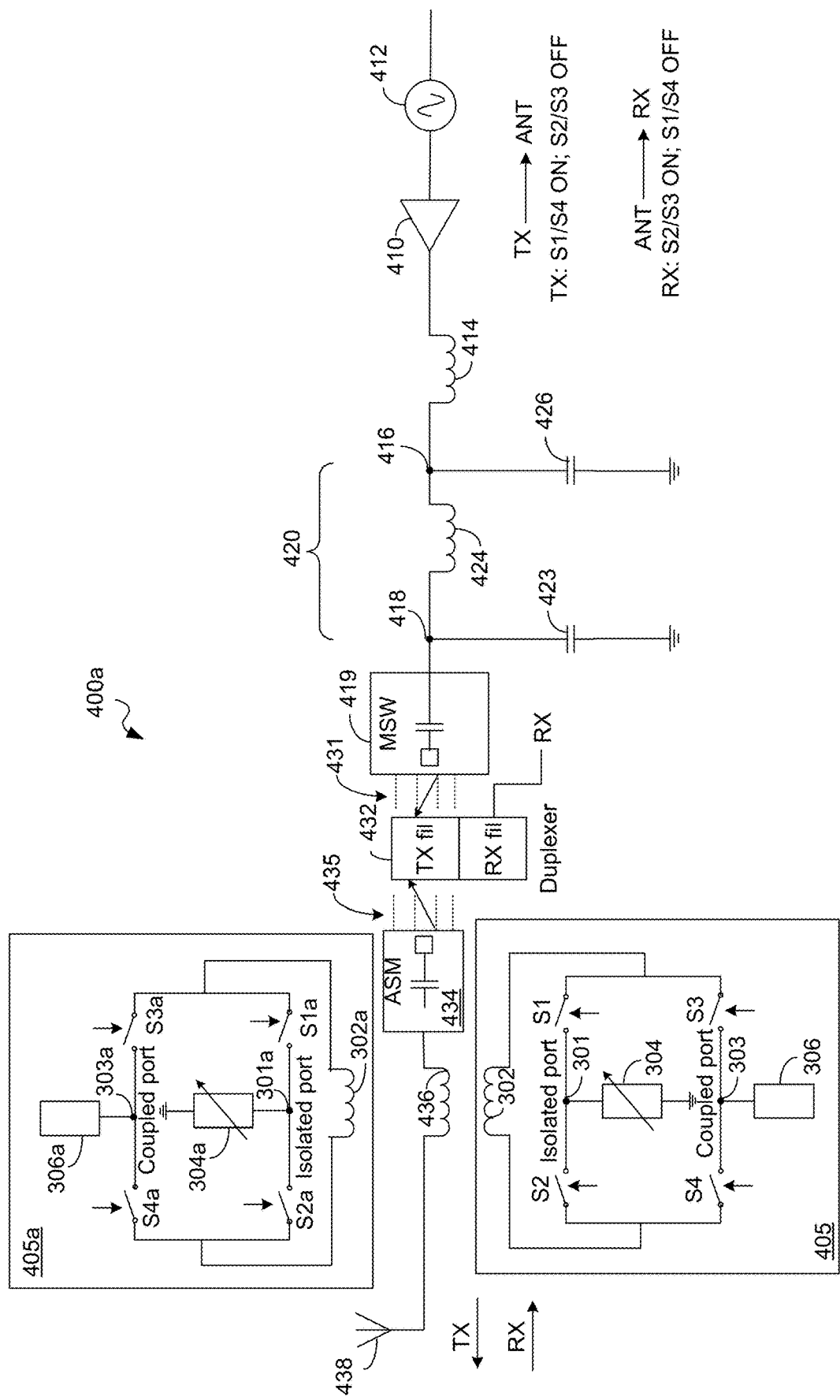
FIG. 4B is a schematic diagram showing an alternative exemplary embodiment of an implementation of the frequency selective coupler of FIG. 3.

FIG. 4B is a schematic diagram showing an alternative exemplary embodiment of an implementation of the frequency selective coupler of FIG. 3. In an exemplary embodiment, a circuit 400a shows an exemplary embodiment of an implementation of parallel instances of a frequency selective coupler. In the example shown in FIG. 4B, an additional frequency selective coupler 405a is implemented in parallel with the frequency selective coupler 405.

In FIG. 4B, a frequency selective coupler is referred to using reference numeral 405a, but it is similar to the frequency selective coupler 305 described in FIG. 3 and the frequency selective coupler 405 described in FIG. 4A. In an exemplary embodiment, the frequency selective coupler 405a may comprise electromagnetic element 302a, impedance network 304a, electrically unconnected element 306a, and switches S1a, S2a, S3a and S4a. In an exemplary embodiment, the switches S1a and S3a may be connected to one side of the inductive element 302a and the switches S2a and S4a may be connected to another side of the inductive element 302a. The inductive element 302a inductively couples to the electromagnetic element 436.

In an exemplary embodiment, in a transmit direction, the switches S1a and S4a may be made conductive and the switches S2a and S3a may be made non-conductive so that the transmit signal is coupled from an input side of the electromagnetic element 302a through the switch S1a to the isolated port 301a and the transmit signal is coupled from an output side of the electromagnetic element 302a through the switch S4a to the coupled port 303a. The coupled port 303a provides the output of the frequency selective coupler 405a.

In an exemplary embodiment, in a receive direction, the switches S2a and S3a may be made conductive and the switches S1a and S4a may be made non-conductive so that the receive signal is coupled from an input side of the electromagnetic element 302a through the switch S2a to the isolated port 301a and the receive signal is coupled from an output side of the electromagnetic element 302a through the switch S3a to the coupled port 303a. The coupled port 303a provides the output of the frequency selective coupler 405a.

In an exemplary embodiment, the switches S1a, S2a, S3a and S4a may be controlled by a control signal from the data processor 210 (FIG. 2) or another controller. In an exemplary embodiment, the two instances of the frequency selective coupler 405 and 405a located in parallel across the electromagnetic element 436 may create different filter responses at different frequencies.

While two instances of a frequency selective coupler are shown in FIG. 4B, such exemplary embodiments may implement more than two instances of the frequency selective coupler in parallel with the electromagnetic element 436 to create additional different filter responses at different frequencies.

Figure 4C:
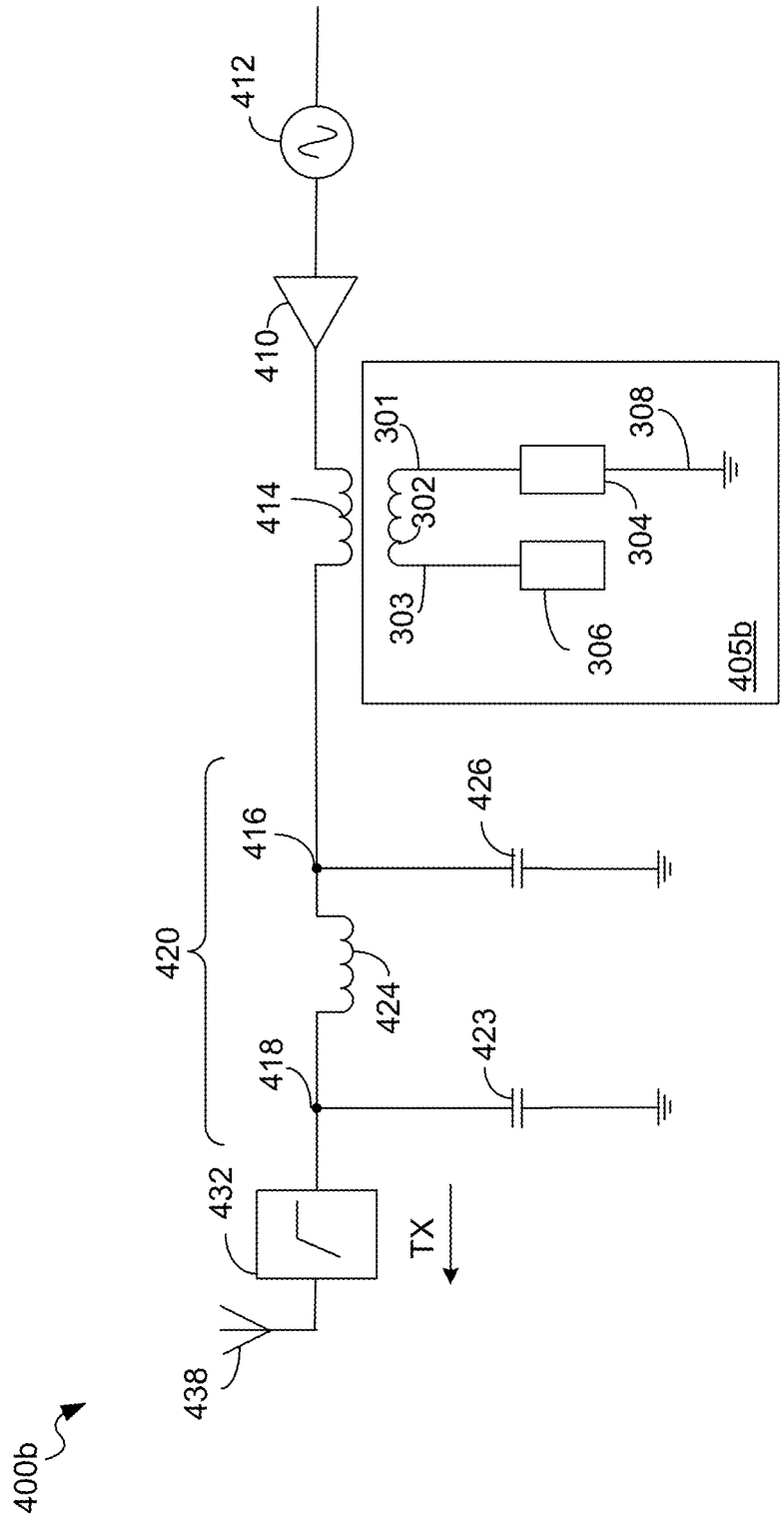
FIG. 4C is a schematic diagram showing an alternative exemplary embodiment of an implementation of the frequency selective coupler of FIG. 3.

FIG. 4C is a schematic diagram showing an alternative exemplary embodiment of an implementation of the frequency selective coupler 305 of FIG. 3. In FIG. 4C, the frequency selective coupler is referred to using reference numeral 405b, but it is similar to the frequency selective coupler 305 described in FIG. 3. In an exemplary embodiment, a circuit 400b in which the frequency selective coupler 405b may be implemented includes the power amplifier 410 that receives a transmit signal from the mixer 412. An output of the power amplifier 410 is provided to the electromagnetic element 414. The trap circuit 420 is coupled to the electromagnetic element 414.

In an exemplary embodiment, the frequency selective coupler 405b may be located at the output of the power amplifier 410 to couple with the electromagnetic element 414 prior to the trap circuit 420. However, in some embodiments the frequency selective coupler 405a can be located such that it is electromagnetically coupled to one of the elements (e.g., one of the inductors) of the trap circuit 420. In the exemplary embodiment shown in FIG. 4C, the filter circuit 432 is connected to the trap circuit 420 and to the antenna 438. In this exemplary embodiment, the circuit 400b may be a circuit configured for transmit only and may not be configured to process a receive signal. In an exemplary embodiment, the frequency selective coupler 405b may be configured to operate as a trap circuit or to provide a notch response. In an exemplary embodiment, the elements in the impedance network 304 contain fixed or adjustable components having values that create a particular filter response.

In an exemplary embodiment, while FIG. 4C shows a filter circuit 432 and an antenna 438 after the trap circuit 420, this is just one example and there may be more or fewer elements between the trap circuit 420 and the antenna 438 (e.g., duplexer, diplexers, additional filters, antenna switching devices, and the like.

Figure 5:
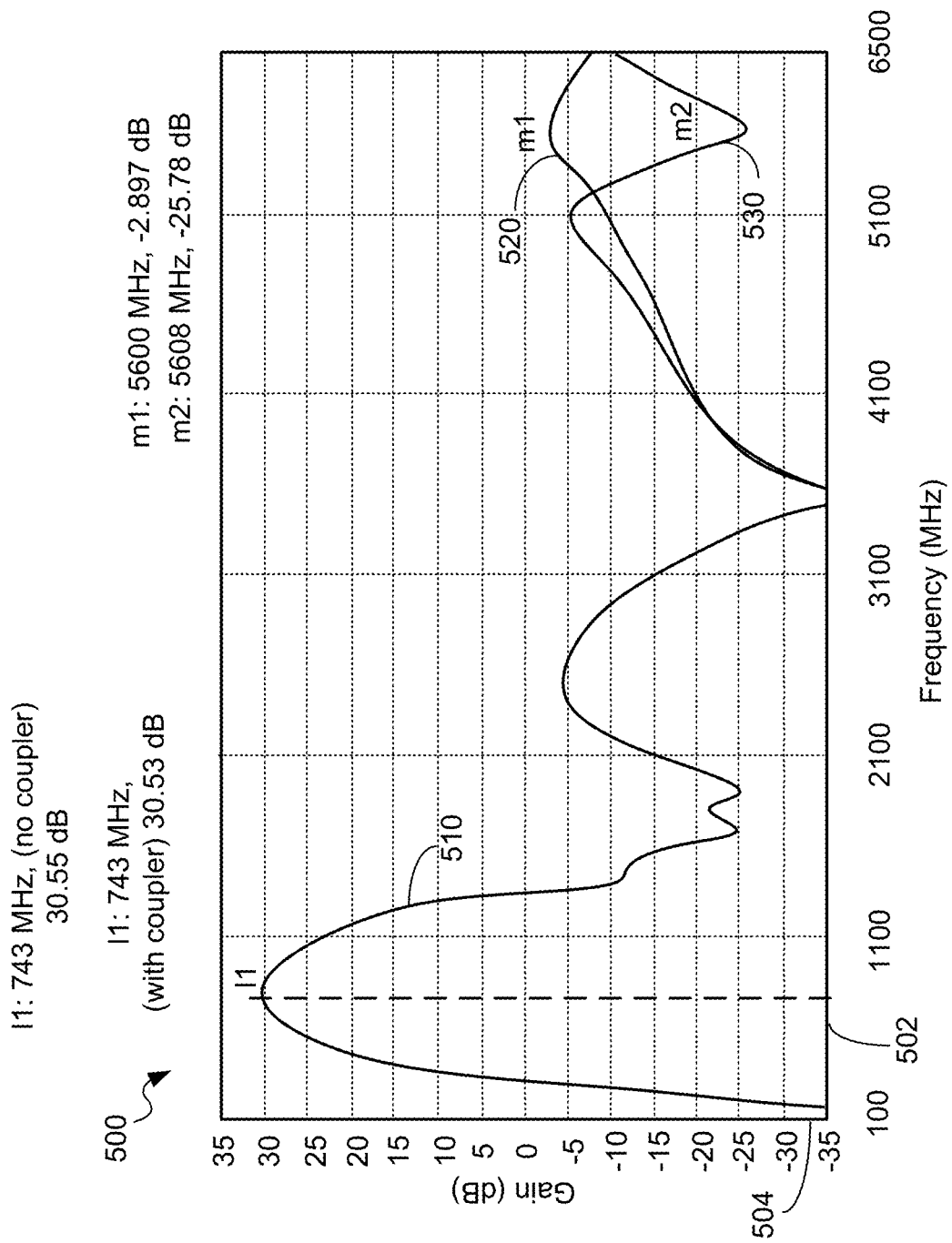
FIG. 5 is a graph showing an exemplary response of the frequency selective coupler of FIG. 4A.

FIG. 5 is a graph 500 showing an exemplary response of the frequency selective coupler of FIG. 4A. The horizontal axis 502 shows frequency in MHz, and the vertical axis 504 shows gain in dB. The trace 510, while shown as a single trace, shows an exemplary circuit response of the circuit 400 in FIG. 4A with and without the frequency selective coupler 405. As shown by the trace 510, the response of the circuit 400 is virtually identical to approximately 3400 MHz showing that a circuit including the frequency selective coupler 405 adds virtually no additional loss at, for example, 743 MHz in this example compared to a circuit that does not include the frequency selective coupler 405.

The trace 520 shows the response of the circuit 400 of FIG. 4A from about 3400 MHz to about 6500 MHz without the frequency selective coupler 405 and the trace 530 shows the response of the circuit 400 of FIG. 4A from about 3400 MHz to about 6500 MHz with the frequency selective coupler 405 configured to provide a notch response at a desired frequency. As shown, at approximately 5600 MHz, the frequency selective coupler 405 creates a notch response (at point m2) that is approximately 22.88 dB deeper than the circuit response at 5600 MHz of the circuit 400 of FIG. 4A (trace 520) that does not include the frequency selective coupler 405 (point m1). In an exemplary embodiment, the frequency at which the frequency selective coupler 405 provides a selectable response comprises approximately 20 dB rejection compared to a signal on the signal path.

Figure 6:
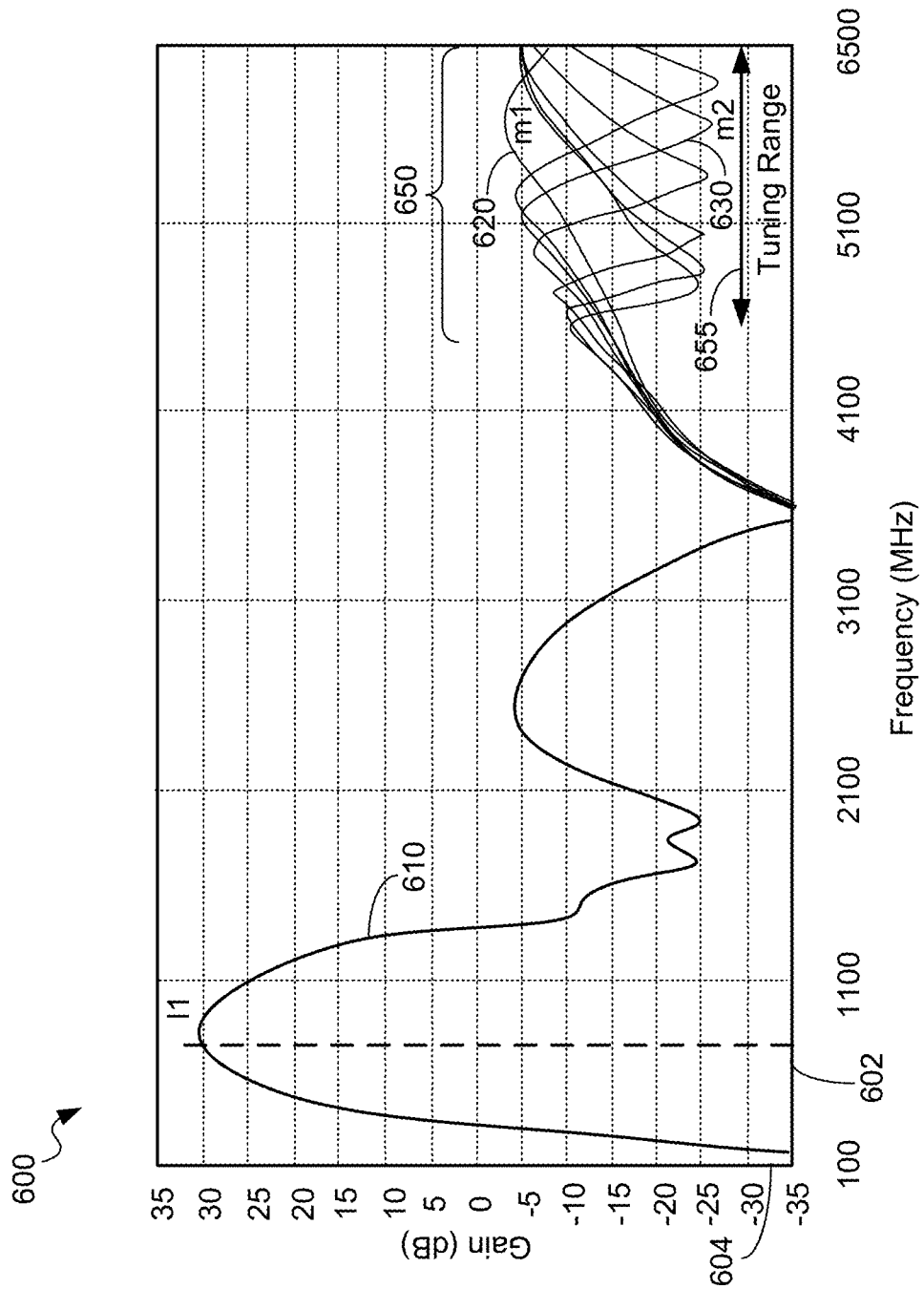
FIG. 6 is a graph showing exemplary responses of the frequency selective coupler of FIG. 4A.

FIG. 6 is a graph 600 showing exemplary responses of the frequency selective coupler of FIG. 4A. The horizontal axis 602 shows frequency in MHz, and the vertical axis 604 shows gain in dB. The trace 610, while shown as a single trace, shows an exemplary circuit response of the circuit in FIG. 4A with and without the frequency selective coupler 405. As shown by the trace 610, the response of the circuit 400 is virtually identical to approximately 3400 MHz showing that a circuit including the frequency selective coupler 405 has virtually no additional loss at, for example, 743 MHz compared to a circuit that does not include the frequency selective coupler 405.

The trace 620 is similar to the trace 520 and the trace 630 is similar to the trace 530. In FIG. 6, additional traces 650 are also shown indicating the frequency adjustability of the frequency selective coupler 405 when the impedance network 304 is implemented using an adjustable circuit, such as an adjustable capacitance. In the example shown in FIG. 6, the impedance network 304 may be configured or adjusted to provide a tuning range 655 over which the impedance network 304 may be configured to provide a range of frequency responses to create multiple notch responses in the approximate frequency range of 4500 MHz to 6500 MHz in this example. Such an exemplary embodiment may implement multiple instances of the frequency selective coupler 405 in parallel with the electromagnetic element 436 to create different filter responses at different frequencies.

Figure 7:
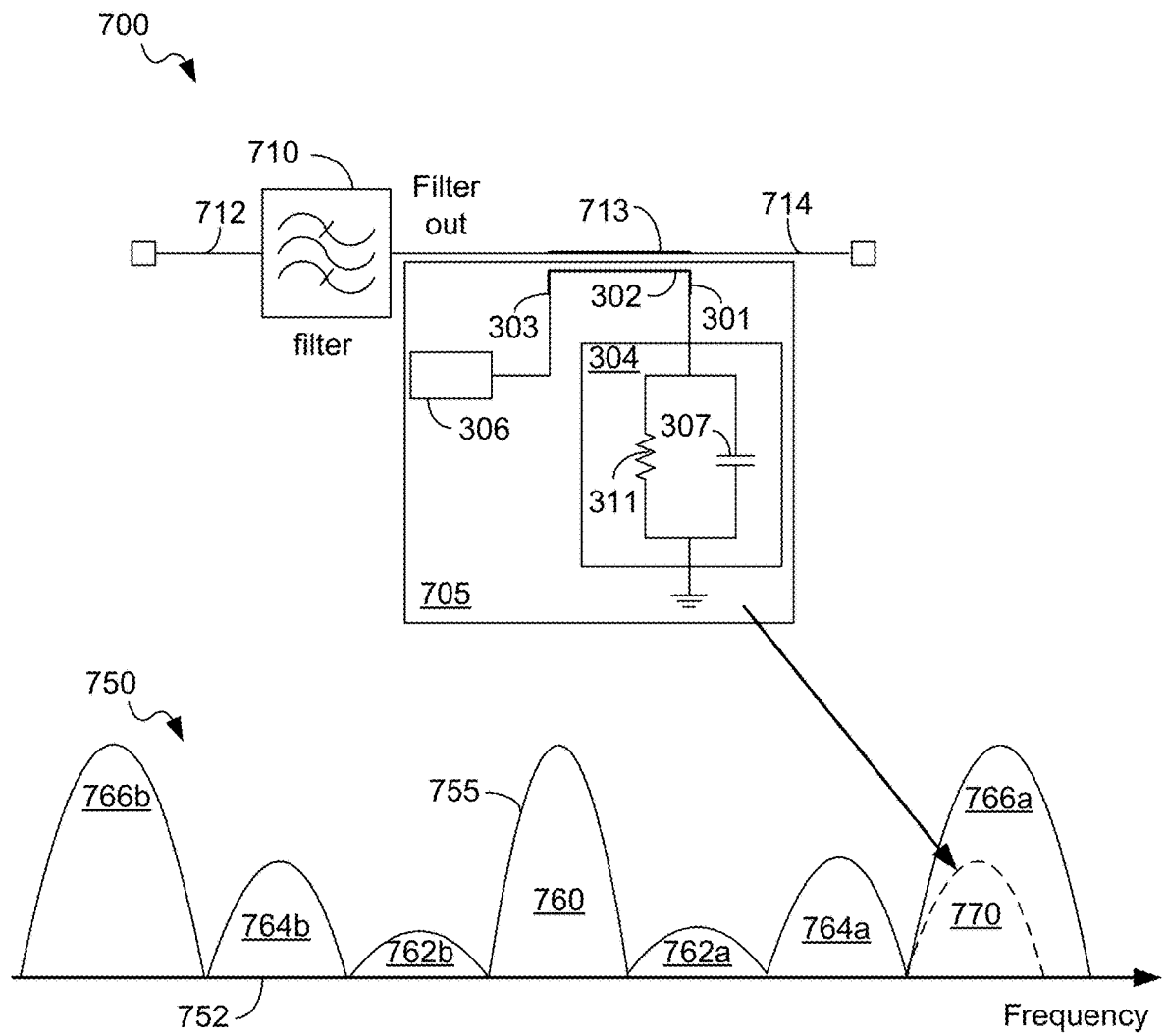
FIG. 7 is a schematic diagram showing another exemplary embodiment of an implementation of the frequency selective coupler of FIG. 3.

FIG. 7 is a schematic diagram showing another exemplary embodiment of an implementation of the frequency selective coupler 305 of FIG. 3. In an exemplary embodiment, the circuit 700 comprises a filter 710 and a frequency selective coupler 705 connected at the output of the filter 710. In an exemplary embodiment, the filter 710 may be a band pass filter or may provide another filter characteristic (e.g., and could be implemented in a variety of ways such as a micro-acoustic filter (e.g., SAW/BAW), electroacoustic filter, or an LC filter or the like). In other embodiments, the frequency selective coupler 705 may be connected at the input of the filter 710. The input of the filter 710 may be provided over connection 712 and an output of the filter 710 may be provided on connection 714. A portion of the output connection 714 of the filter 710 may comprise an inductive element 713 configured to electromagnetically couple to the electromagnetic element 302 of the frequency selective coupler 705. In an exemplary embodiment, the portion of the inductive element 713 may be part of a signal path that carries a transmit (TX) signal and/or a receive (RX) signal.

In FIG. 7, the frequency selective coupler is referred to using reference numeral 705, but it is similar to the frequency selective coupler 305 described in FIG. 3. In an exemplary embodiment, the frequency selective coupler 705 may comprise an impedance network 304 having a capacitive element 307 and a resistive element 311 connected to the isolated port 301 (although alternative RC or LRC networks are possible). In the example of FIG. 7, the impedance network 304 comprises a parallel RC network. The electrically unconnected element 306 is connected on one side to the coupled port 303 and is electrically open on the other side, thereby being electrically unconnected. In the example shown in FIG. 7, the output port (the coupled port 303) is terminated with the "electrical open" of the electrically unconnected element 306 instead of being connected to a load, which results in the frequency selective coupler 705 behaving like a filter in this example.

FIG. 7 also shows a graph 750 having a horizontal axis 752 representing frequency increasing to the right. The trace 755 includes a fundamental frequency portion 760 and harmonics 762a, 764a and 766a at frequency intervals that increase with respect to the fundamental frequency portion 760 and harmonics 762b 764b, and 766b at frequency intervals that decrease with respect to the fundamental frequency portion 760. The harmonic 766a is an example of a third harmonic of the fundamental frequency portion 760 and depending on implementation, may have sufficient magnitude so as to cause interference with other signals that may be present at the same or close to the same frequency as the harmonic 766a. In an exemplary embodiment, the frequency selective coupler 705 may be configured to reduce the third harmonic 766a (or another harmonic) of the fundamental frequency portion 760 to a level below that which may interfere with other communication signals at the same or similar frequency as the harmonic. In an exemplary embodiment, the effect of the electrically unconnected element 306 together with the components in the impedance network 304 operate to allow the frequency selective coupler 705 to provide the desired filter response while adding no additional elements to the signal path. The frequency portion 770 illustrates the ability of the frequency selective coupler 705 to reduce the signal energy of a harmonic (in this example, the third harmonic 766a) to a level below which it may interfere with another signal at that or close to that frequency. In an exemplary embodiment, the frequency at which the frequency selective coupler 705 provides approximately 20 dB rejection compared to the third harmonic 766a. In an exemplary embodiment, the frequency selective coupler 705 can enhance out-of-band (OOB) rejection using a coupling path having no physical connection to the inductive element 713 (i.e., signal path) without adding any additional costly and lossy lump elements at the signal path.

Figure 8A:
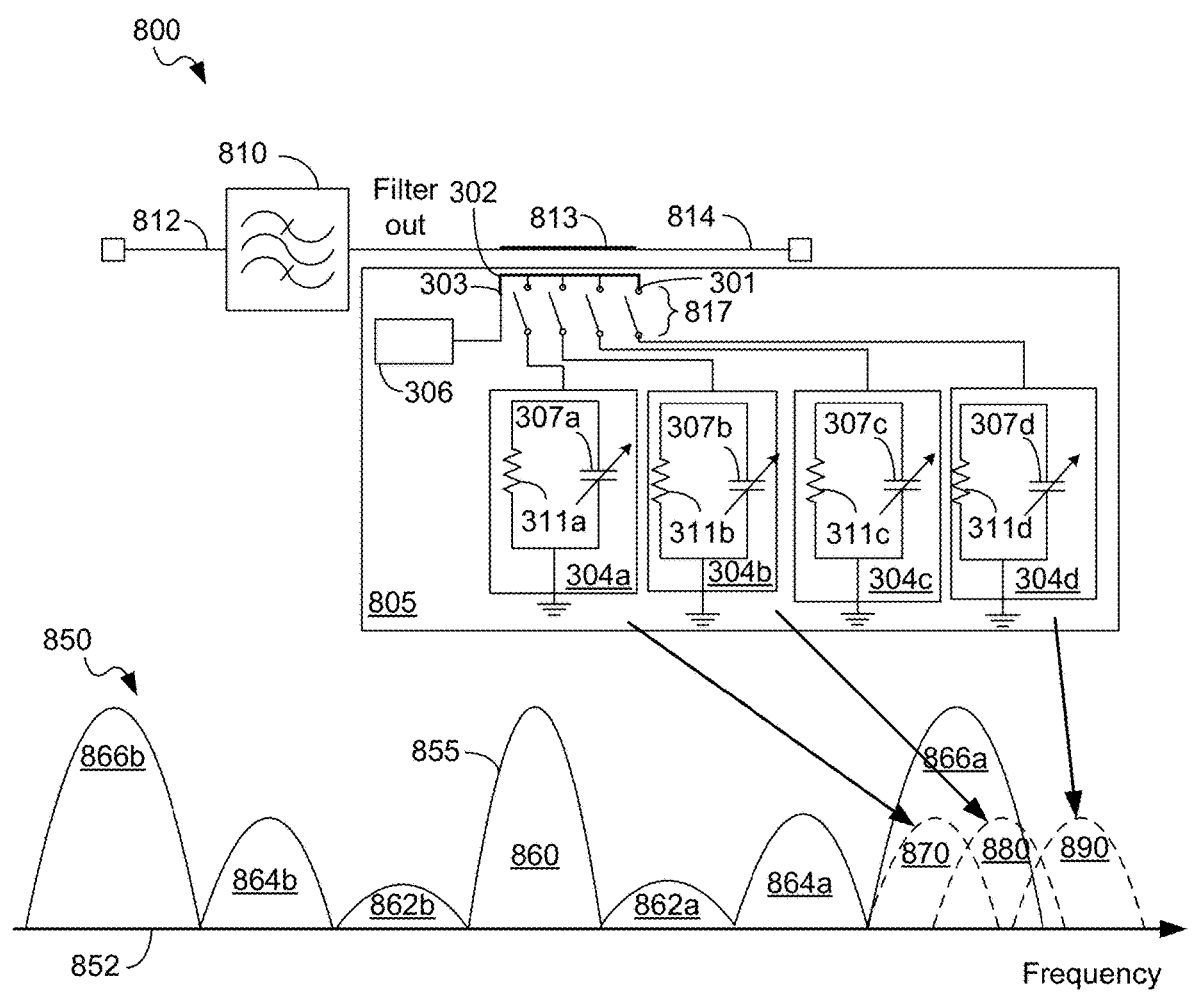
FIG. 8A is a schematic diagram showing another exemplary embodiment of an implementation of the frequency selective coupler of FIG. 3.

FIG. 8A is a schematic diagram showing another exemplary embodiment of an implementation of the frequency selective coupler 305 of FIG. 3. Elements in FIG. 8A that are similar to elements in FIG. 7 will be referred to using the designation 8XX, where an element in FIG. 8A labeled 8XX is similar to an element in FIG. 7 labeled 7XX. In an exemplary embodiment, the circuit 800 comprises a filter 810 and a frequency selective coupler 805 connected at the output of the filter 810. In other embodiments, the frequency selective coupler 805 may be connected at the input of the filter 810. The input of the filter 810 may be provided over connection 812 and an output of the filter 810 may be provided on connection 814. A portion of the output connection 814 of the filter 810 may comprise an inductive element 813 configured to electromagnetically couple to the electromagnetic element 302. In an exemplary embodiment, the inductive element 813 may be part of a signal path that carries a transmit (TX) signal and/or a receive (RX) signal.

In FIG. 8A, the frequency selective coupler is referred to using reference numeral 805, but it is similar to the frequency selective coupler 305 described in FIG. 3. In an exemplary embodiment, the frequency selective coupler 805 may comprise a plurality of impedance networks 304a, 304b, 304c and 304d, each having a respective capacitive element 307a, 307b, 307c and 307d, and a respective resistive element 311a, 311b, 311c and 311d. In an exemplary embodiment, each impedance network 304a, 304b, 304c and 304d may be switchably connected to the electromagnetic element 302 through a respective switch 817. The switches 317 are collectively referred to using the reference numeral 317 for ease of illustration. In this example, there are four switches 817 corresponding to the four impedance networks 304a, 304b, 304c and 304d. In an exemplary embodiment, the switches 817 may be individually controlled by a control signal from the data processor 210 (FIG. 2) or another controller. Although shown in FIG. 8A as having four impedance networks 304a, 304b, 304c and 304d, the frequency selective coupler 805 may have other numbers of impedance networks.

FIG. 8A also shows a graph 850 having a horizontal axis 852 representing frequency increasing to the right. The trace 855 includes a fundamental frequency portion 860 and harmonics 862a, 864a and 866a at frequency intervals that increase with respect to the fundamental frequency portion 860 and harmonics 862b 864b, and 866b at frequency intervals that decrease with respect to the fundamental frequency portion 860. The harmonic 866a is an example of a third harmonic of the fundamental frequency portion 860 and depending on implementation, may have sufficient magnitude so as to cause interference with other signals that may be present. In an exemplary embodiment, the frequency selective coupler 805 may be configured to provide multiple selective filter responses to reduce the third harmonic 866a (or another harmonics) of the fundamental frequency portion 860 to a level below that which may interfere with other communication signals. In this example, three filter responses corresponding to frequency portions 870, 880 and 890 are illustrated. The frequency portions 870, 880 and 890 illustrate the ability of the frequency selective coupler 805 to reduce harmonics or other signals at other selectable frequencies based on whether one or more of the switches 317 are conductive. In an exemplary embodiment, the frequency portions 870, 880 and 890 may comprise filter responses that, in this example, correspond to the impedance networks 304a, 304b and 304d being connected to the impedance element 302. For example, the response shown in frequency portion 870 may correspond to the impedance network 304a being switchably connected to the electromagnetic element 302. Similarly, the response shown in frequency portion 880 may correspond to the impedance network 304b being switchably connected to the electromagnetic element 302; and the response shown in frequency portion 890 may correspond to the impedance network 304d being switchably connected to the electromagnetic element 302. One or more of the impedance networks 304a, 304b, 304c and 304d may be connected to the impedance element 302 via the switches 817.

Figure 8B:
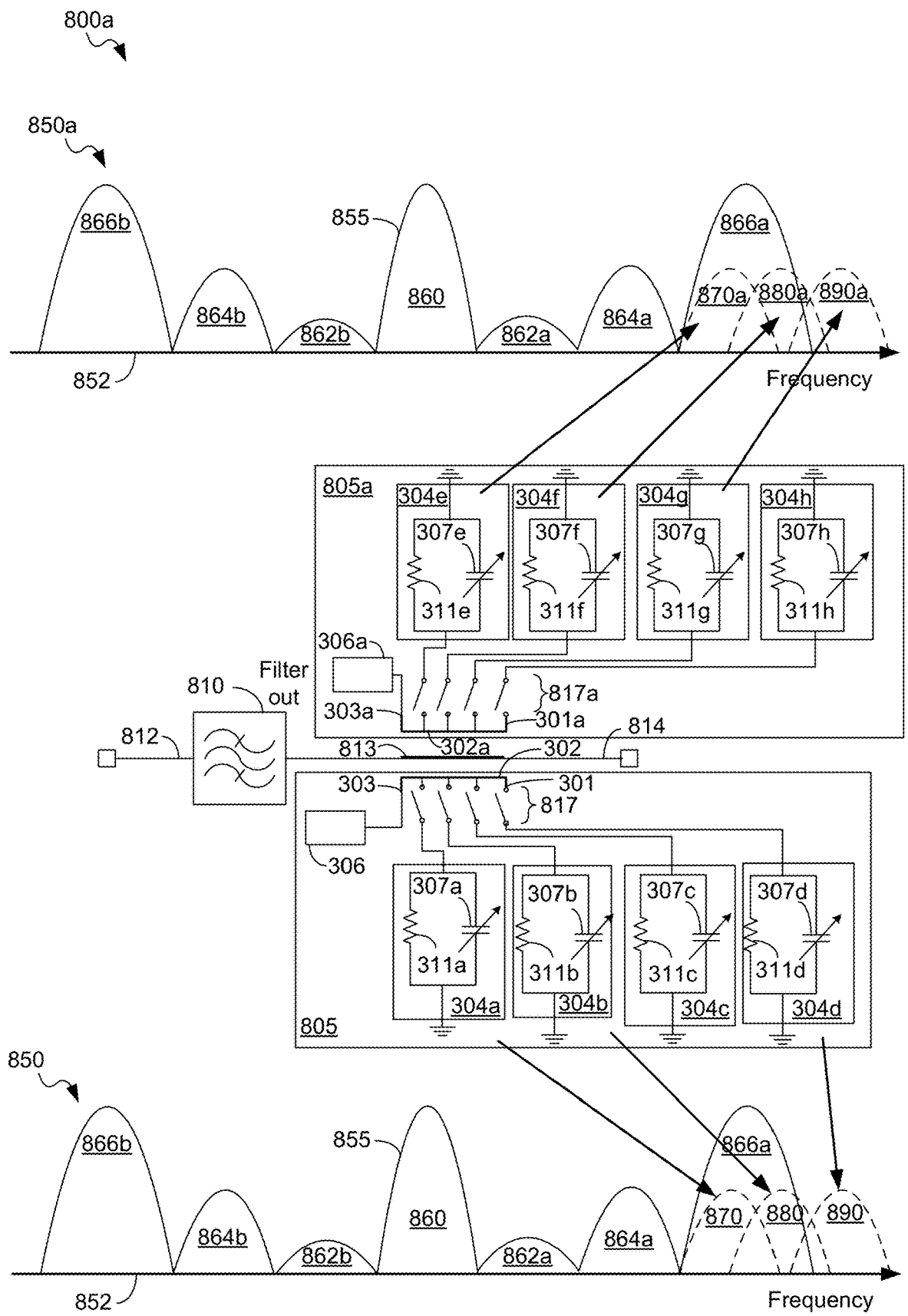
FIG. 8B is a schematic diagram showing another exemplary embodiment of an implementation of the frequency selective coupler of FIG. 8A.

FIG. 8B is a schematic diagram showing an exemplary embodiment of an alternative embodiment of an implementation of the frequency selective coupler of FIG. 8A. In an exemplary embodiment, a circuit 800a shows an exemplary embodiment of an implementation of parallel instances of a frequency selective coupler. In the example shown in FIG. 8B, an additional frequency selective coupler 805a is implemented in parallel with the frequency selective coupler 805.

In FIG. 8B, a frequency selective coupler is referred to using reference numeral 805a, but it is similar to the frequency selective coupler 805 described in FIG. 8A. In an exemplary embodiment, the frequency selective coupler 805a may comprise electromagnetic element 302a, impedance networks 304e, 304f, 304g and 304h, electrically unconnected element 306a, and switches 817a. In an exemplary embodiment, the inductive element 302a inductively couples to the electromagnetic element 813 so that the frequency selective coupler 805a may be coupled in parallel with the frequency selective coupler 805 across the electromagnetic element 813. In an exemplary embodiment, the switches 817a may be individually controlled by a control signal from the data processor 210 (FIG. 2) or another controller.

FIG. 8B also shows a graph 850a having a horizontal axis 852 representing frequency increasing to the right. The graph 850a is similar to the graph 850. However, in an exemplary embodiment, the frequency selective coupler 805a may be configured to provide multiple filter responses different than the filter responses provided by the frequency selective coupler 805. In this example, three filter responses corresponding to frequency portions 870a, 880a and 890a are illustrated. The frequency portions 870a, 880a and 890a illustrate the ability of the frequency selective coupler 805a to reduce harmonics or other signals at other selectable frequencies. In an exemplary embodiment, the frequency portions 870a, 880a and 890a may comprise filter responses that, in this example, correspond to the impedance networks 304e, 304f and 304g. For example, the response shown in frequency portion 870a may correspond to the impedance network 304e being switchably connected to the electromagnetic element 302a. Similarly, the response shown in frequency portion 880a may correspond to the impedance network 304f being switchably connected to the electromagnetic element 302a; and the response shown in frequency portion 890a may correspond to the impedance network 304g being switchably connected to the electromagnetic element 302a. One or more of the impedance networks 304e, 304f, 304g and 304h may be connected to the impedance element 302a via the switches 817a.

Figure 9:
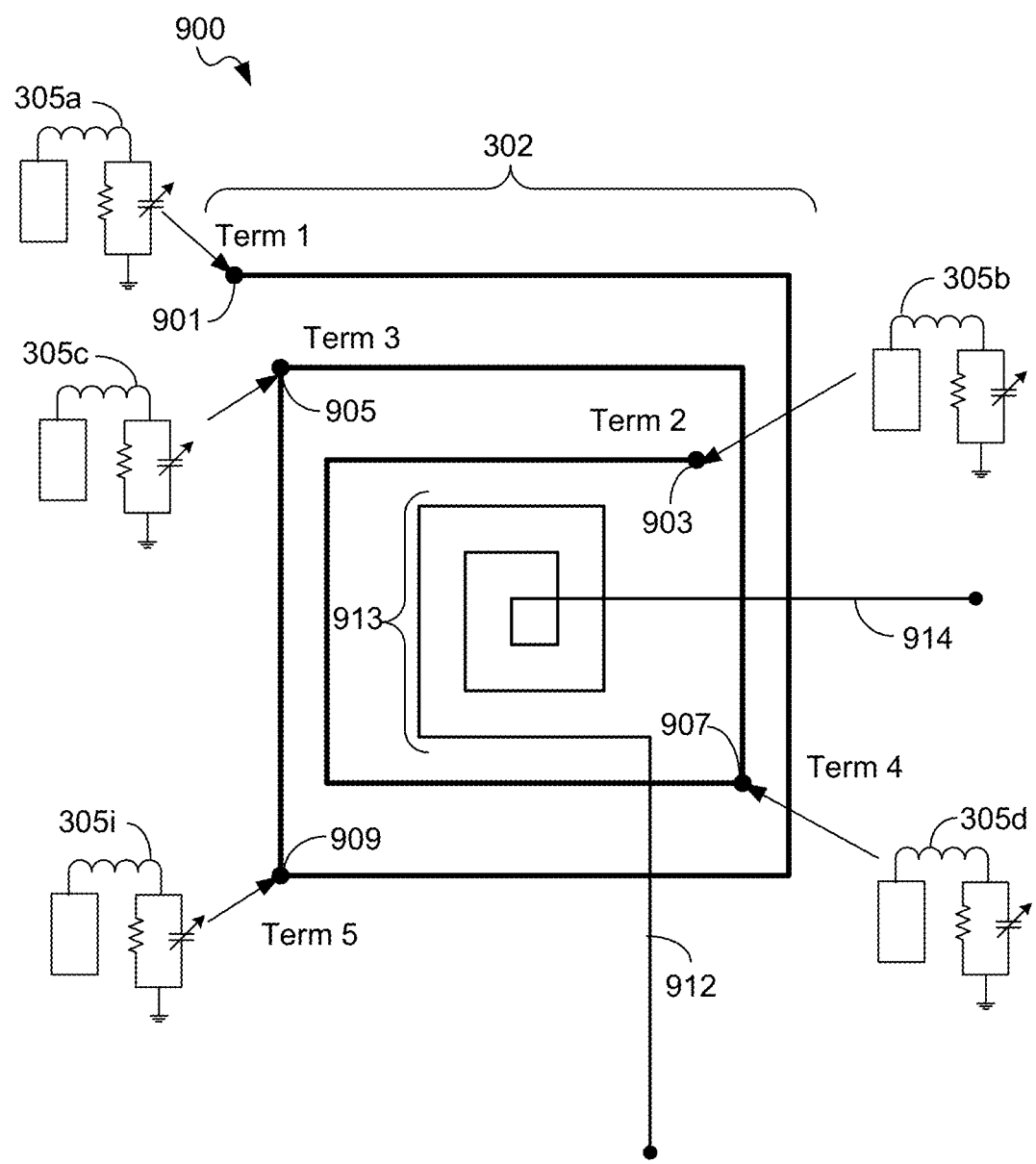
FIG. 9 is a schematic diagram showing an exemplary embodiment of an implementation of the frequency selective coupler of FIG. 3.

FIG. 9 is a schematic diagram 900 showing an exemplary embodiment of an implementation of the frequency selective coupler 305 of FIG. 3. In an exemplary embodiment, the diagram 900 comprises an input connection 912, an inductive element 913 and an output connection 914. In an exemplary embodiment, the inductive element 913 may be an example of the inductive element 713 of FIG. 7 or the inductive element 813 of FIG. 8A or FIG. 8B.

The diagram 900 also includes an example of an electromagnetic element 302. The electromagnetic element 302 may comprise one or more terminations to which exemplary embodiments of the impedance network 304 may be connected. For example, as described with regard to FIG. 8A, a plurality of frequency selective filters 305a, 305b, 305c, 305d and 305i may be connected to respective terminations 901, 903, 905, 907 and 909. Each of the plurality of frequency selective filters 305a, 305b, 305c, 305d and 305i may be configured to produce the same or a different response. Depending on which termination is connected, the overall circuit response of a circuit having the architecture shown in FIG. 9 can be adjusted based on a desired operating characteristic.

Figure 10:
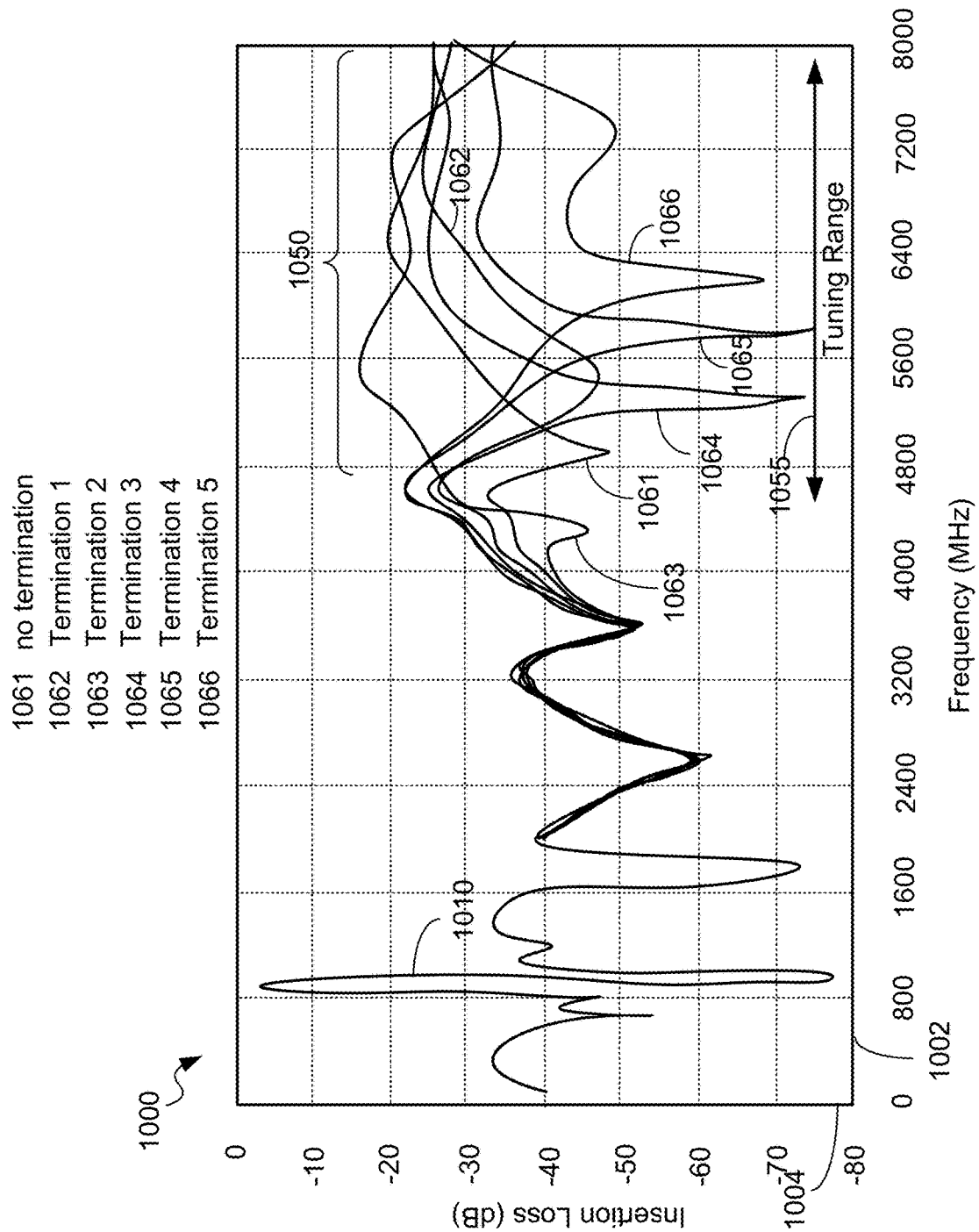
FIG. 10 is a graph showing exemplary responses of the frequency selective coupler of FIG. 8A and the architecture of FIG. 9.

FIG. 10 is a graph 1000 showing exemplary responses of the frequency selective coupler of FIG. 8A and the architecture of FIG. 9. The horizontal axis 1002 shows frequency in MHz, and the vertical axis 1004 shows insertion loss in dB. The trace 1010, while shown as a single trace, shows an exemplary circuit response of the circuit in FIG. 8A with and without embodiments of the frequency selective coupler 305a, 305b, 305c, 305d and 305i. As shown by the trace 1010, the response of the circuit 800 is virtually identical to approximately 2000 MHz.

The traces 1050 illustrate circuit response when different instances of the frequency selective filters 305a, 305b, 305c, 305d and 305i are connected to various terminations 901, 903, 905, 907 and 909 of FIG. 9.

For example, the trace 1061 shows an exemplary circuit response when no frequency selective coupler is connected. The trace 1062 shows an exemplary circuit response when the frequency selective coupler 305a is connected to termination 901 (FIG. 9). The trace 1063 shows an exemplary circuit response when the frequency selective coupler 305b is connected to termination 903 (FIG. 9). The trace 1064 shows an exemplary circuit response when the frequency selective coupler 305c is connected to termination 905 (FIG. 9). The trace 1065 shows an exemplary circuit response when the frequency selective coupler 305d is connected to termination 907 (FIG. 9). The trace 1066 shows an exemplary circuit response when the frequency selective coupler 305i is connected to termination 909 (FIG. 9).

Figure 11:
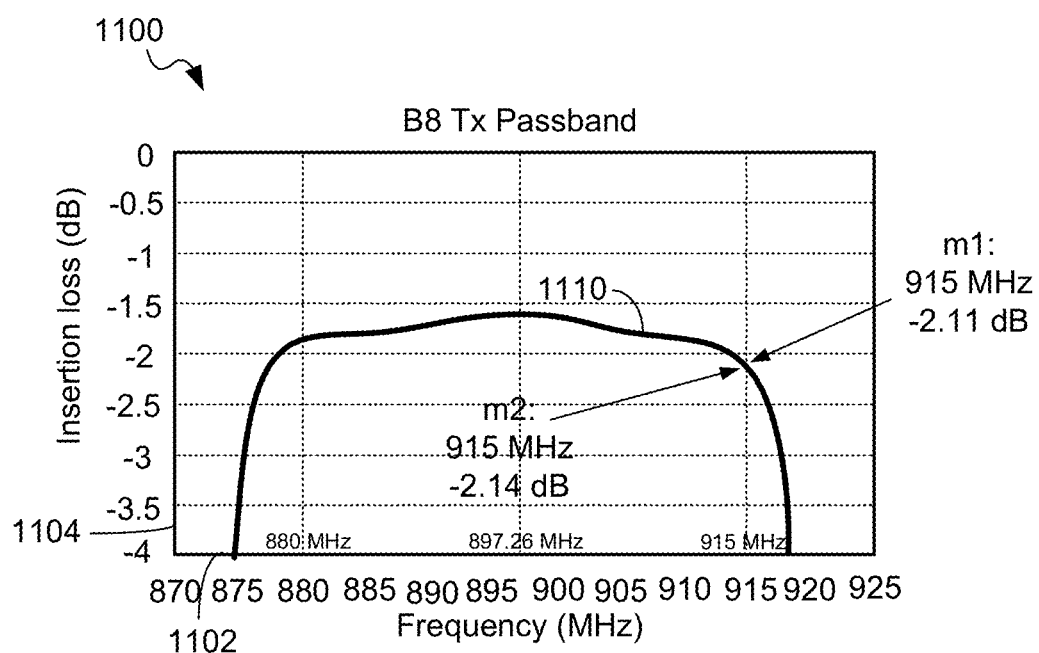
FIG. 11 is a graph showing passband insertion loss.

FIG. 11 is a graph 1100 showing passband insertion loss. The horizontal axis 1102 shows frequency in MHz and the vertical axis 1104 shows insertion loss in dB.

The trace 1110 shows a portion of the trace 1010 (FIG. 10) spanning approximately 875 MHz to approximately 920 MHz, and shows that in a passband that spans approximately 880 MHz to approximately 915 MHz, there is virtually no effect on insertion loss regardless of which of the frequency selective couplers 305a, 305b, 305c, 305d and 305i are connected to terminations 901, 903, 905, 907 and 909 of FIG. 9.

Figure 12:
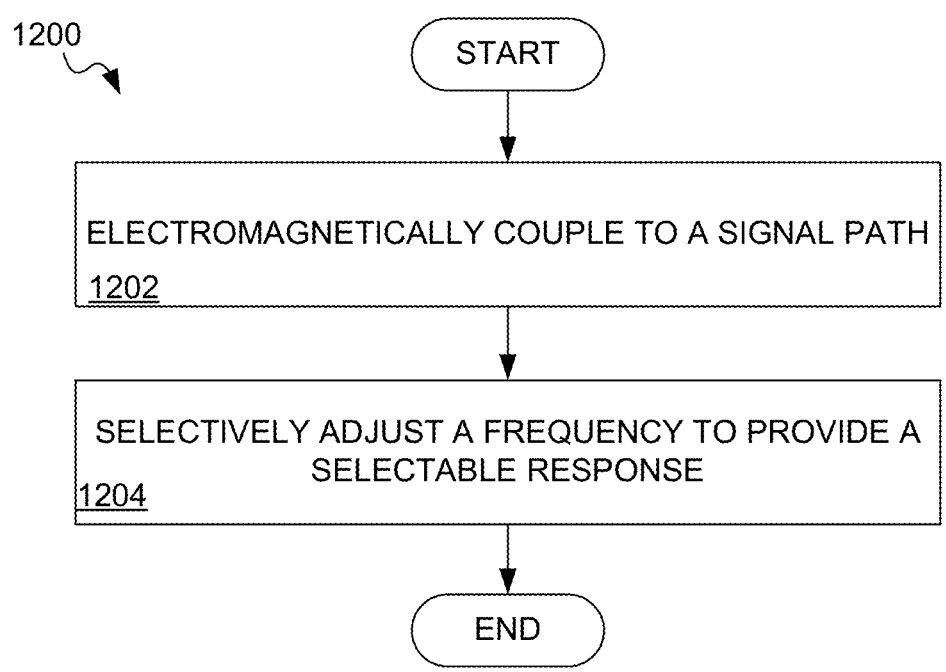
FIG. 12 is a flow chart describing an example of a coupling method.

FIG. 12 is a flow chart 1200 describing an example of a coupler method 1200. The blocks in the method 1200 can be performed in or out of the order shown, and in some embodiments, can be performed at least in part in parallel.

In block 1202, a frequency selective coupler may be electromagnetically coupled to a signal path. For example, the electromagnetic element 302 may couple to the electromagnetic element 436.

In block 1204, a frequency of a frequency selective coupler may be adjusted to provide a selectable response. For example, the frequency selective coupler 405 may be adjusted to provide a notch filter response at a desired frequency.

Figure 13:
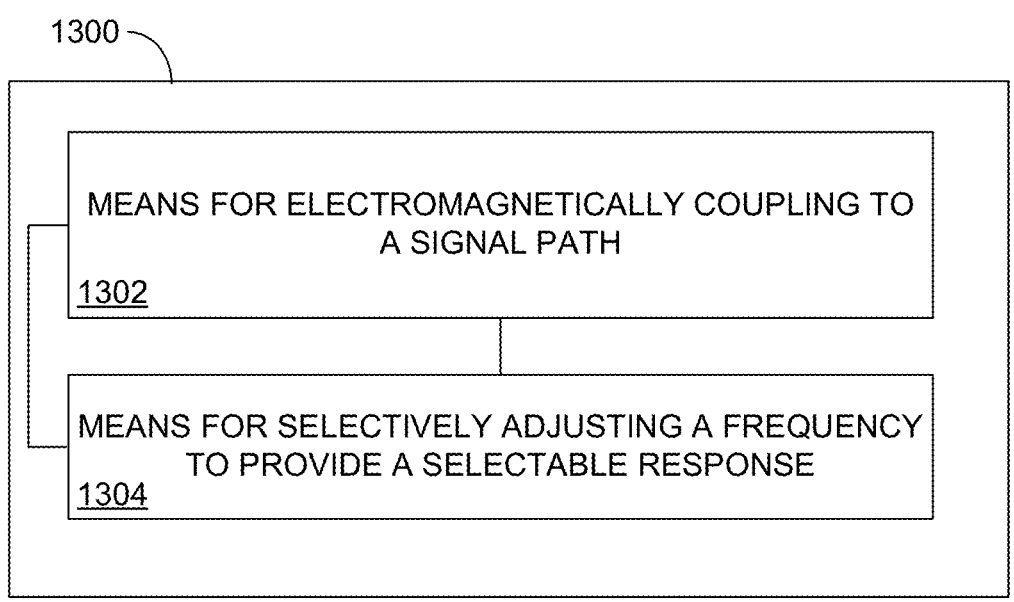
FIG. 13 is a functional block diagram of an apparatus for selectively adjusting a coupler.

FIG. 13 is a functional block diagram of an apparatus 1300 for selectively adjusting a coupler. The apparatus 1300 comprises means 1302 for coupling to a signal path. In certain embodiments, the means 1302 for coupling to a signal path can be configured to perform one or more of the functions described in operation block 1202 of method 1200 (FIG. 12). In an exemplary embodiment, the means 1302 for coupling to a signal path may comprise the electromagnetic element 302 coupling to the electromagnetic element 436.

The apparatus 1300 also comprises means 1304 for adjusting a frequency of a frequency selective coupler to provide a selectable response. The means 1304 for adjusting a frequency of a frequency selective coupler to provide a selectable response can be configured to perform one or more of the functions described in operation block 1204 of method 1200 (FIG. 12). In an exemplary embodiment, the means 1304 for adjusting a frequency of a frequency selective coupler to provide a selectable response may comprise adjusting the frequency selective coupler 405 to provide a notch filter response at a desired frequency.

Implementation examples are described in the following numbered clauses:

1. A frequency selective coupler configured as a harmonic rejection filter, comprising: an electromagnetic element configured to electromagnetically couple to a signal path between an output of a power amplifier and an antenna; an impedance network coupled between an isolated port of the coupler and ground, the impedance network configured to provide a harmonic filter response; and an electrically unconnected coupled port connected to the electromagnetic element.
2. The coupler of clause 1, wherein the coupler is electromagnetically coupled to a power amplifier (PA) load line output.
3. The coupler of clause 1 or clause 2, wherein the impedance network comprises at least one of a resistor, an inductor and a capacitor.
4. The coupler of clause 3, wherein the capacitor has an adjustable capacitance.
5. The coupler of any of clauses 2 through 4, wherein the electromagnetic element comprises an inductor.
6. The coupler of any of clauses 2 through 5, wherein the harmonic filter response is a selectable notch response and occurs at a harmonic of the frequency of a signal on the signal path.
7. The coupler of any of clauses 2 through 6, wherein the frequency at which the coupler provides the harmonic filter response comprises approximately 20 dB rejection compared to a signal on the signal path.
8. The coupler of any of clauses 2 through 7, wherein the impedance network is configured to provide a plurality of selectable filter responses.
9. The coupler of clause 8, wherein the plurality of selectable filter responses are implemented in parallel with the signal path.
10. The coupler of any of clauses 2 through 9, further comprising a first pair of switches configured to selectively connect the electrically unconnected coupled port and the impedance network to a first side of the electromagnetic element and a second pair of switches configured to selectively connect the electrically unconnected coupled port and the impedance network to a second side of the electromagnetic element.
11. A frequency selective coupler associated with a filter, comprising: an electromagnetic element configured to electromagnetically couple to a signal path of a filter; an impedance network coupled between an isolated port of the coupler and ground, the impedance network configured to provide a filter response; and an electrically unconnected coupled port connected to the electromagnetic element.
12. The coupler of clause 11, wherein the coupler is electromagnetically coupled to an output of a filter.
13. The coupler of clause 11, wherein the impedance network comprises at least one of a resistor, an inductor and a capacitor.
14. The coupler of clause 13, wherein the capacitor comprises an adjustable capacitance.
15. The coupler of any of clauses 12 through 14, wherein the impedance network is a parallel RC circuit.

16. The coupler of any of clauses 12 through 15, wherein the filter response occurs at a harmonic of the frequency of the signal on the signal path.
17. The coupler of any of clauses 12 through 16, wherein the frequency at which the coupler provides a filter response comprises approximately 20 dB rejection compared to a signal on the signal path.
18. The coupler of any of clauses 12 through 17, wherein the impedance network is configured to provide a plurality of selectable filter responses.
19. The coupler of any of clauses 12 through 18, wherein the filter is an electroacoustic filter.
20. A frequency selective coupler, comprising: an electromagnetic element configured to electromagnetically couple to a signal path; an impedance network coupled between an isolated port of the coupler and ground, the impedance network configured to selectively adjust a frequency at which the coupler provides a filter response; and an electrically unconnected coupled port connected to the electromagnetic element.
21. The coupler of clause 20, wherein the coupler is electromagnetically coupled to a power amplifier (PA) load line output.
22. The coupler of clause 21 or 21, wherein the coupler is electromagnetically coupled to a filter.
23. The coupler of any of clauses 20 through 22, wherein the impedance network is a parallel RC circuit.
24. The coupler of any of clauses 20 through 23, wherein the impedance network comprises an adjustable capacitance.
25. The coupler of any of clauses 20 through 24, wherein the electromagnetic element comprises an inductor.
26. The coupler of any of clauses 20 through 25, wherein the filter response occurs at a harmonic of the frequency of the signal on the signal path.
27. The coupler of any of clauses 20 through 26, wherein the impedance network is configured to provide a plurality of selectable filter responses.
28. The coupler of clause 27, wherein the plurality of selectable filter responses are implemented in parallel with the signal path.
29. A method for providing signal rejection, comprising: electromagnetically coupling an electromagnetic element to a signal path; and selectively adjusting a frequency at which a filter response is provided to a signal on the signal path using a frequency selective coupler.
30. The method of clause 29, wherein the filter response occurs at a harmonic of the frequency of the signal on the signal path.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A frequency selective coupler configured as a harmonic rejection filter, comprising:
    an electromagnetic element configured to electromagnetically couple to a signal path between an output of a power amplifier and an antenna;
    an impedance network coupled between an isolated port of the coupler and ground, the impedance network configured to provide a harmonic filter response, wherein the impedance network comprises at least one of a resistor, an inductor and a capacitor; and
    an electrically unconnected coupled port connected to the electromagnetic element.
2. The coupler of claim 1, wherein the coupler is electromagnetically coupled to a load line output of the power amplifier.
3. The coupler of claim 1, further comprising a first pair of switches configured to selectively connect the electrically unconnected coupled port and the impedance network to a first side of the electromagnetic element and a second pair of switches configured to selectively connect the electrically unconnected coupled port and the impedance network to a second side of the electromagnetic element.
4. The coupler of claim 1, wherein the capacitor has an adjustable capacitance.
5. The coupler of claim 1, wherein the electromagnetic element comprises an inductor.
6. The coupler of claim 1, wherein the harmonic filter response is a selectable notch response and occurs at a harmonic of the frequency of a signal on the signal path.
7. The coupler of claim 1, wherein the frequency at which the coupler provides the harmonic filter response comprises approximately 20 dB rejection compared to a signal on the signal path.
8. The coupler of claim 1, wherein the impedance network is configured to provide a plurality of selectable filter responses.
9. The coupler of claim 8, wherein the plurality of selectable filter responses are implemented in parallel with the signal path.
10. A frequency selective coupler associated with a filter, comprising:
    an electromagnetic element configured to electromagnetically couple to a signal path of the filter;
    an impedance network coupled between an isolated port of the coupler and ground, the impedance network configured to provide a filter response, wherein the impedance network comprises at least one of a resistor, an inductor and a capacitor; and
    an electrically unconnected coupled port connected to the electromagnetic element.
11. The coupler of claim 10, wherein the filter is an electroacoustic filter.
12. The coupler of claim 10, wherein the coupler is electromagnetically coupled to an output of the filter.

13. The coupler of claim 10, wherein the impedance network is configured to provide a plurality of selectable filter responses.

14. The coupler of claim 10, wherein the capacitor comprises an adjustable capacitance.

15. The coupler of claim 10, wherein the impedance network is a parallel RC circuit.

16. The coupler of claim 10, wherein the filter response occurs at a harmonic of the frequency of a signal on the signal path.

17. The coupler of claim 10, wherein the frequency at which the coupler provides the filter response comprises approximately 20 dB rejection compared to a signal on the signal path.

18. A method for providing signal rejection, comprising:
electromagnetically coupling an electromagnetic element to a signal path; and
selectively adjusting a frequency at which a filter response is provided to a signal on the signal path using a frequency selective coupler that includes an impedance network having at least one of a resistor, an inductor and a capacitor coupled between an isolated port of the frequency selective coupler and ground and an electrically unconnected coupled port connected to the electromagnetic element.

19. The method of claim 18, wherein the filter response occurs at a harmonic of the frequency of the signal on the signal path.

20. A frequency selective coupler configured as a harmonic rejection filter, comprising:
an electromagnetic element configured to electromagnetically couple to a signal path between an output of a power amplifier and an antenna;
an impedance network coupled between an isolated port of the coupler and ground, the impedance network configured to provide a harmonic filter response; and
an electrically unconnected coupled port connected to the electromagnetic element, wherein the coupler is electromagnetically coupled to a load line output of the power amplifier.

21. The coupler of claim 20, wherein the coupler is electromagnetically coupled to a filter.

22. The coupler of claim 20, wherein the impedance network is a parallel RC circuit.

23. The coupler of claim 20, wherein the impedance network comprises an adjustable capacitance.

24. The coupler of claim 20, wherein the electromagnetic element comprises an inductor.

25. The coupler of claim 20, wherein the filter response occurs at a harmonic of the frequency of a signal on the signal path.

26. The coupler of claim 20, wherein the impedance network is configured to provide a plurality of selectable filter responses.

27. The coupler of claim 26, wherein the plurality of selectable filter responses are implemented in parallel with the signal path.

* * * * *